United States Patent [19]

Slobodnik, Jr.

[11] 3,725,827

[45] Apr. 3, 1973

[54] HIGH COUPLING LOW DIFFRACTION ACOUSTIC SURFACE WAVE DELAY LINE

[75] Inventor: Andrew J. Slobodnik, Jr., Burlington, Mass.

[73] Assignee: The United States of America as represented by the Secretary of the Air Force

[22] Filed: May 17, 1972

[21] Appl. No.: 254,121

[52] U.S. Cl. .......... 333/30, 310/9.5
[51] Int. Cl. .......... H03h 7/30
[58] Field of Search .......... 333/30; 310/9.5

[56] References Cited

UNITED STATES PATENTS

| | | | |
|---|---|---|---|
| 3,680,009 | 7/1972 | Slobodnik, Jr. | 333/30 |
| 3,568,079 | 3/1971 | Yoder | 333/30 |
| 2,490,216 | 12/1949 | Jaffe | 310/9.5 |
| 3,591,813 | 7/1971 | Coquin | 310/9.5 |
| 3,601,639 | 8/1971 | Hannon | 333/72 |
| 3,568,080 | 3/1971 | Troutman | 333/30 |
| 3,525,885 | 8/1970 | Ballman et al. | 333/72 X |

OTHER PUBLICATIONS

"Acoustic Attenuation of a Single–Domain Lithium Niobate Crystal at Microwave Frequencies" by Mayo et al., Vol. 9, No. 4, August 15, 1966, Applied Physics Letters, pps. 135 & 136.

*Primary Examiner*—Herman Karl Saalbach
*Assistant Examiner*—Saxfield Chatmon, Jr.
*Attorney*—Harry A. Herbert, Jr. et al.

[57] ABSTRACT

An acoustic surface wave delay line having a lithium niobate substrate member the surface wave propagation plane of which is parallel to the lithium niobate crystalline X axis and intersects the crystalline Z and -Y axes. Optimum results are obtained when the intersecting angle of the propagation plane and the Z axis is in the vicinity of 16.5°.

3 Claims, 3 Drawing Figures

HIGH COUPLING LOW DIFFRACTION ACOUSTIC SURFACE WAVE DELAY LINE

BACKGROUND OF THE INVENTION

This invention relates to acoustic surface wave devices and particularly to microwave frequency acoustic delay lines requiring long time delays.

Volume or bulk wave acoustic devices such as acoustic delay lines, phase shifters and directional couplers have been used in microwave systems for some time. Recently in an attempt to reduce power requirements considerable effort has been expended to perfect various acoustic surface wave devices.

Microwave frequency surface wave devices have several advantages over their volume wave counterparts. Surface waves require only one optically polished surface whereas volume waves require two surfaces which must be parallel to optical tolerances. The fabrication techniques for surface wave transducers are the same as those used for integrated circuits so that a surface wave delay line could, for example, be fabricated on a substrate member together with a transistor amplifier. The current state of the art of microwave acoustic surface wave devices is reviewed in detail in the publication, The Generation and Propagation of Acoustic Surface Waves at Microwave Frequencies, by Paul H. Carr, IEEE Transactions on Microwave Theory and Techniques, Vol. MTT, No. 11, November 1969.

The acoustic surface wave delay lines represented by the current state of the art, while being in many respects superior tö electromagnetic devices, are still subject to various limitations. For instance, in order to achieve 50 ohm operation of an acoustic device in a microwave system, conventional acoustic devices require matching networks. This requirement of course adds weight, cost, and circuit complexity to the system. Other deficiencies of currently available acoustic delay lines include limited bandwidth, low electromagnetic to acoustic energy conversion efficiency, diffraction losses, and high frequency limitations for a given transducer linewidth. There is currently a need therefore for inexpensive, efficient, broadband microwave frequency acoustic delay lines that are capable of long time delays. Copending patent application Ser. No. 125,572, now U.S. Pat. No. 3,680,009, entitled Acoustic Surface Wave Delay Line, filed Mar. 18, 1971, by Andrew J. Slobodnik, Jr., discloses an X propagating acoustic surface wave lithium niobate delay line whose propagating surface is cut at an angle of 41° to the crystalline Z axis. This delay line satisfies many of the requirements above noted. However, simultaneous higher coupling and lower diffraction losses have yet to be attained. Delay lines utilizing Y cut Z propagating lithium niobate substrate members exhibit excellent low diffraction propagation, but they lack many of the advantages of the 41° cut X-propagating crystal. Unfortunately, low beam steering and low diffraction losses are mutually exclusive properties requiring a design tradeoff for any given application. The present invention is therefore directed toward providing an acoustic surface wave delay line that achieves higher coupling while at the same time preserves the low diffraction properties of Y cut X propagating lithium niobate.

SUMMARY OF THE INVENTION

The present invention is an acoustic surface wave delay line fabricated from a single crystal lithium niobate substrate member. The acoustic surface wave propagation surface is cut in a plane parallel to the lithium niobate crystalline X axis and in intersecting relationship with the crystalline Z and −Y axes. Optimum results are achieved when the angle of intersection of the propagation surface and the Z axis is 16.5°. Input and output transducers are put on the propagation surface by standard photolithographic techniques and are oriented to effect propagation of the acoustic surface waves in the Y Z plane. The geometry, dimensions and relative positions of the transducer are determined by the operating frequency, delay time requirement, and other parameters of the particular device specified.

It is a principal object of the invention to provide a new and improved acoustic surface wave delay line.

It is another object of the invention to provide an acoustic surface wave delay line that has higher coupling and thus wider bandwidth and lower insertion loss than currently available devices and that simultaneously preserves the low diffraction properties of Y cut Z propagating lithium niobate delay line substrate members.

These, together with other objects, features and advantages of the invention will become more readily apparent from the following detailed description when taken in conjunction with the illustrative embodiment of the accompanying drawings.

DETAILED DESCRIPTION OF THE PREFERRED EMBODIMENT

Figure 1:
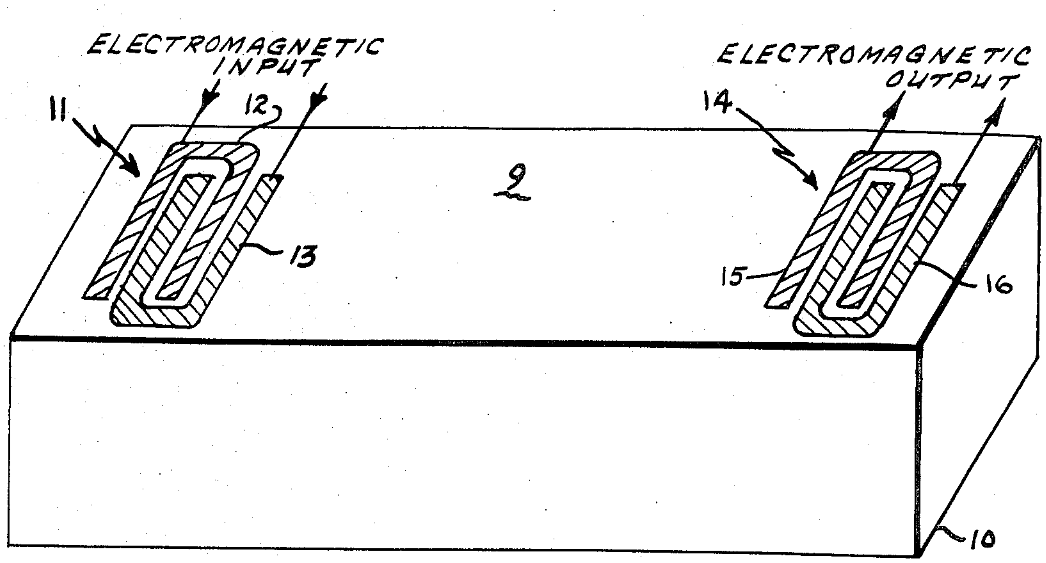
FIG. 1 is an orthogonal view of a microwave frequency acoustic surface wave delay line as comprehended by the present invention.
Figure 2:
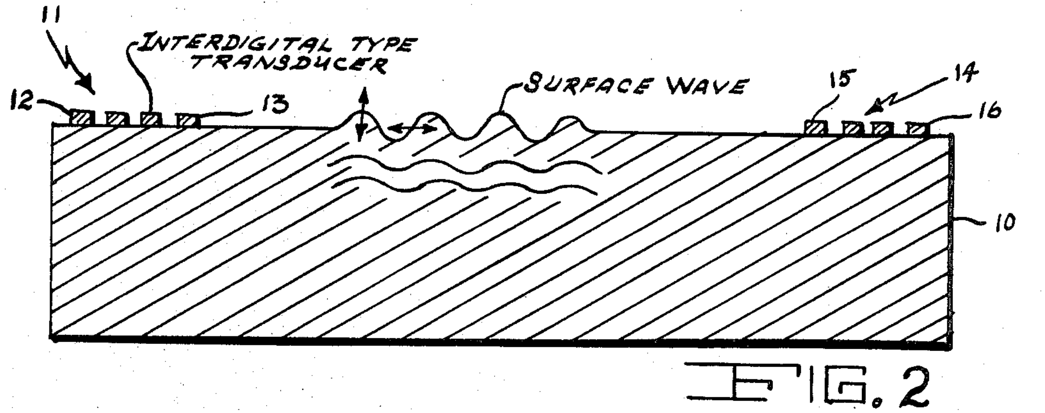
FIG. 2 is a side view of the delay line of FIG. 1 schematically illustrating acoustic surface waves propagating therealong.

Referring now to FIGS. 1 and 2, there is illustrated thereby an acoustic surface wave delay line comprising substrate member 10, input transducer 11, and output transducer 14. Substrate member 10 is fabricated of single crystal lithium niobate ($LiNbO_3$). Input transducer 11 consists of interdigital fingers 12 and 13 which may be affixed to the propagating surface 9 by standard photolithographic techniques. Output transducer 14 consisting of interdigital fingers 15 and 16 is similarly affixed to propagation surface 9. Operation of the device is illustrated by FIG. 2. The electromagnetic wave input produces an electric field between the half wave spaced lines of the interdigital type transducer on the piezoelectric (lithium niobate) substrate. The piezoelectric effect produces a stress which propagates along the surface in both directions, the two acoustic powers being equal by symmetry. The surface wave propagating toward the output transducer is detected by means of the piezoelectric effect. The wave propagating in the opposite direction can be terminated by an acoustic absorber such as wax or tape (not shown).

Figure 3:
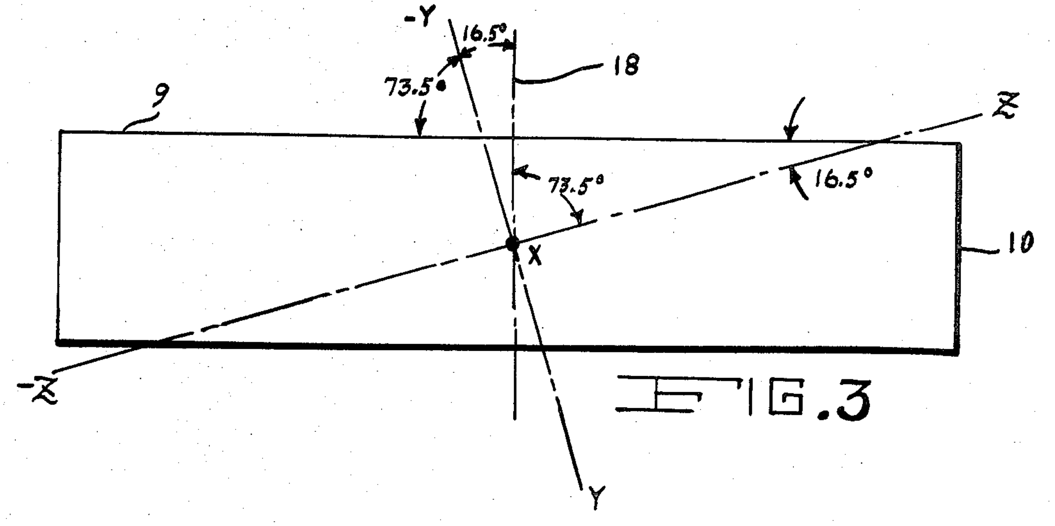
FIG. 3 is a side view of the delay line substrate member of FIG. 1 schematically illustrating the relationship of the propagation surface to the substrate member's crystalline X, Y and Z axes.

The essence of the present invention resides in the discovery of a high coupling, low diffraction cut for acoustic surface wave propagation on lithium niobate. Such a cut is illustrated by FIG. 3.

In accordance with the principle of the invention, substrate member 10 must be fabricated of single crystal lithium niobate. The acoustic surface wave propagating surface 9 must be parallel to the crystalline X axis with its length in the direction of the crystalline Z axis. It must also intersect the crystalline −Y and Z axes as shown. It has been found that optimum performance can be achieved when the normal 18 of the propagating surface 9 is approximately 73.5° from the Z axis. Effective delay lines that achieve the various objects of the invention are provided if the angle between the normal 18 and the crystalline Z axis falls within the 71.5° and 75.5° range. It is essential that correct axis signs be observed. The interdigital transducers are deposited on both ends of the polished surface 9 using photolithographic techniques. The distance between the transducers determines the delay time according to the formula:

delay time (seconds) = distance (meter)/3503 (1)

where 3503 is the surface wave velocity.

By way of example, a particular delay line has been developed having a delay time of 5.7 microseconds that is capable of a 23.6 db insertion loss with 8.8 percent bandwidth at 995 MHz. This device utilized 20 fingers or 10 pairs for the interdigital transducers which are 200 microns long. Line width and spacing are both 0.85 microns. These parameters, of course, vary for operation at different frequencies. Actual operation of the device is accomplished by placing an alternating electromagnetic potential (within the design band of the transducer) across the interdigital fingers. Input and output are accomplished in a reciprocal manner.

While the invention has been described in one presently preferred embodiment, it is understood that the words which have been used are words of description rather than words of limitation and that changes within the purview of the appended claims may be made without departing from the scope and spirit of the invention in its broader aspects.

What is claimed is:

1. A lithium niobate acoustic surface wave delay line having its propagation surface parallel to the lithium niobate crystalline X axis and in intersecting relationship with the lithium niobate crystalline Z and −Y axes, the intersecting angle between said propagation surface and said crystalline Z axis being not less than 14.5° and not greater than 18.5°.

2. A lithium niobate acoustic surface wave delay line as defined in claim 1 wherein the intersecting angle between said propagation surface and said crystalline Z axis is substantially 16.5°.

3. An acoustic surface wave delay line comprising a single crystal lithium niobate substrate member having a propagation surface adapted to permit the propagation of acoustic surface waves therealong, said propagation surface being parallel with the substrate crystalline X axis and intersecting the substrate crystalline Z and −Y axes at 16.5° and 73.5° respectively, an electromagnetic wave to acoustic wave input transducer disposed on said propagation surface, and an acoustic surface wave to electromagnetic wave output transducer disposed on said propagation surface.

* * * * *